(12) United States Patent
Liu et al.

(10) Patent No.: US 6,662,126 B2
(45) Date of Patent: Dec. 9, 2003

(54) MEASURING SKEW USING ON-CHIP SAMPLING

(75) Inventors: Dean Liu, Sunnyvale, CA (US); Gin S. Yee, Sunnyvale, CA (US); Tyler J. Thorp, Sunnyvale, CA (US); Pradeep R. Trivedi, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 193 days.

(21) Appl. No.: 09/930,012

(22) Filed: Aug. 14, 2001

(65) Prior Publication Data

US 2003/0036862 A1 Feb. 20, 2003

(51) Int. Cl.[7] .................. G06F 19/00; G11B 20/20
(52) U.S. Cl. .................. 702/69; 702/106; 702/117; 714/700
(58) Field of Search .................. 702/57, 58, 64–66, 702/69–73, 75, 79, 85, 89, 106, 108, 117–121; 324/76.11, 76.15, 76.38, 76.47, 76.55, 76.82; 714/700

(56) References Cited

U.S. PATENT DOCUMENTS

| | | | | |
|---|---|---|---|---|
| 4,928,278 A | * | 5/1990 | Otsuji et al. | 714/700 |
| 5,003,256 A | * | 3/1991 | Merrill | 714/814 |
| 5,231,598 A | * | 7/1993 | Vlahos | 714/700 |
| 5,760,478 A | * | 6/1998 | Bozso et al. | 257/777 |
| 5,991,890 A | * | 11/1999 | Brown et al. | 713/503 |
| 6,587,976 B1 | * | 7/2003 | Yun et al. | 714/700 |

* cited by examiner

Primary Examiner—Patrick Assouad
Assistant Examiner—Manuel L Barbee
(74) Attorney, Agent, or Firm—Rosenthal&Osha L.L.P.

(57) ABSTRACT

A method and apparatus to determine skew of an on-chip signal without physical probing of the on-chip signal on the chip is provided. The method and apparatus use an externally generated reference signal that is distributed to one or more on-chip samplers that input the on-chip signal. Then, by modulating the externally generated reference signal, transitions of the on-chip signal can be detected at the one or more on-chip samplers so that the skew of the on-chip signal can be determined.

18 Claims, 7 Drawing Sheets

MEASURING SKEW USING ON-CHIP SAMPLING

BACKGROUND OF INVENTION

A typical computer system includes numerous computer chips (also referred to as "chips" and "integrated circuits"), which are small pieces of semiconducting material (usually silicon) on which integrated circuits are embedded. In order to electronically couple a computer chip to other parts of the computer system, various chip packages are used.

A chip package, which houses semiconductor devices in strong, thermally stable, hermetically sealed environments, provides a semiconductor device with electronically connectivity to circuitry external to the semiconductor device. FIG. 1 shows one prior art type of chip package assembly that involves wire bond connections. The wire bonding process involves mounting a computer chip (20) to a substrate (22) with its inactive backside (24) down. Wires (not shown) are then bonded between an active side (26) of the computer chip (20) and the chip package (not shown).

FIG. 2 shows a more recently developed prior art type of chip package assembly that involves flip-chip connections. A flip-chip (40) is a semiconductor chip having bumps (42) on bond pads (not shown) formed on the active side (44) of the chip (40), where the bumps (42) are used as electrical and mechanical connectors. The chip (40) is then inverted and bonded to a substrate (46) by means of the bumps (42). In other words, the front or active side of the chip (40) is attached to the chip package. Several materials, such as conductive polymers and metals (referred to as "solder bumps"), are commonly used to form the bumps (42) on the chip (40). If the bumps (42) are solder bumps, the solder bumps (not shown) can be used to form solder joints between the chip (40) and the substrate (46).

Regardless of how the chip (40) is attached to the substrate (46), a gap (48) exists between the chip (40) and the surface of the substrate (52). Because the chip (40) and the substrate (46) have different material properties, e.g., different coefficients of thermal expansion, different operating temperatures, different mechanical properties, etc., stress develops in the solder joints formed by the bumps (42) between the substrate (46) and the chip (40). Therefore, in order to enhance the integrity of the solder joints, an underfill material (50) is introduced into the gap (48) between the substrate (46) and the chip (40).

As a periodic signal is distributed to various parts of a chip through a chip package, the arrival time of the periodic signal edges at different points on the chip may vary due to process variations, voltage variations, thermal variations, etc. that are inherent in the chip and the chip package. This difference in the arrival time of the periodic signal edges at different points on the chip is typically referred to as skew. Because skew may adversely affect the performance of a chip, accurately measuring skew and being able to compensate for the measured skew has become an important concern for chip designers.

With traditional chip packages such as those that expose the active side of the chip, skew can be measured by physically accessing the chip and probing a particular signal at different points on the chip. However, with flip-chip packages, this sort of probing is not feasible because the active side of the chip rests on the chip package, and is thus not exposed to allow conventional signal probing techniques.

SUMMARY OF INVENTION

In one aspect, a method for measuring skew of an on-chip signal on a computer chip comprises distributing an externally generated reference signal to the computer chip, inputting the externally generated reference signal and the on-chip signal to a first on-chip sampler, where the first on-chip sampler resides at a first point on the computer chip, inputting the externally generated reference signal and the on-chip signal to a second on-chip sampler, where the second on-chip sampler resides at a second point on the computer chip, selectively modulating the externally generated reference signal to determine at least one transition of the on-chip signal at the first point and the second point, and determining skew of the on-chip signal between the first point and the second point dependent upon an output from the first on-chip sampler and an output from the second on-chip sampler.

In another aspect, a method for measuring skew of an on-chip signal on a computer chip comprises selectively modulating an externally generated reference signal to detect a transition of the on-chip signal at a first on-chip sampler, outputting a first transition indication from the first on-chip sampler when the transition is detected at the first on-chip sampler, selectively modulating the externally generated reference signal to detect the transition of the on-chip signal at a second on-chip sampler, outputting a second transition indication from the second on-chip sampler when the transition is detected at the second on-chip sampler, and determining skew of the on-chip signal between a location of the first on-chip sampler and a location of the second on-chip sampler based on the difference between the first transition indication and the second transition indication.

In another aspect, an on-chip sampler that is used to measure skew of an on-chip signal comprises an inverting/buffering stage that inputs an externally generated reference signal and generates a first control signal and a second control signal that are used in the on-chip sampler, a first stage that inputs the on-chip signal and outputs a signal to the second stage based on the first and second control signals, and a second stage that inputs the signal outputted from the first stage based on the first and second control signals, where the externally generated reference signal is modulated to detect a transition on the on-chip signal.

In another aspect, a distribution of on-chip samplers comprises a first on-chip sampler positioned at a first point on a computer chip, a second on-chip sampler positioned at a second point on the computer chip, and a last on-chip sampler positioned at a last point on the computer chip, where an externally generated reference signal and an on-chip signal serves as inputs to the first, second, and last on-chip samplers.

Other aspects and advantages of the invention will be apparent from the following description and the appended claims.

DETAILED DESCRIPTION

The present invention relates to a method and apparatus for measuring skew using on-chip sampling. Further, the present invention relates to a method and apparatus for observing a signal at different points on a computer chip.

The present invention uses an externally generated reference signal (also referred to as "reference signal" and "sampling signal") to sample a global on-chip signal (also referred to as "on-chip signal"). The externally generated reference signal is distributed to a plurality of on-chip samplers. Then, at one or more on-chip samplers, the global on-chip signal is selectively measured at sampling signal edges. By modulating the phase of the sampling signal, the phase needed to sample a transition of the global on-chip signal may be deciphered. This transition of the global on-chip signal is then digitized and sent to an output of the chip. Thereafter, by analyzing the outputs from various on-chip samplers, the skew of the global on-chip signal between different points on the chip can be determined.

Figure 1:
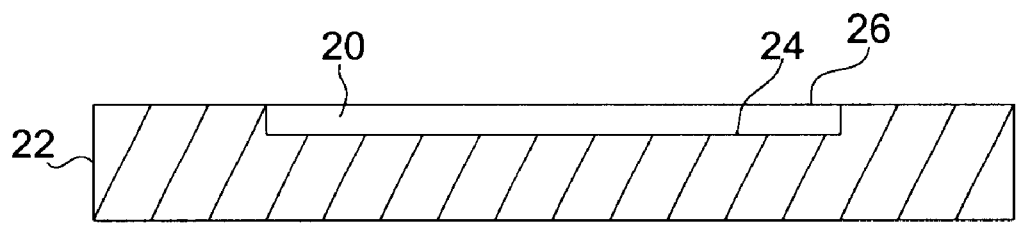
FIG. 1 shows a prior art chip package assembly.
Figure 2:
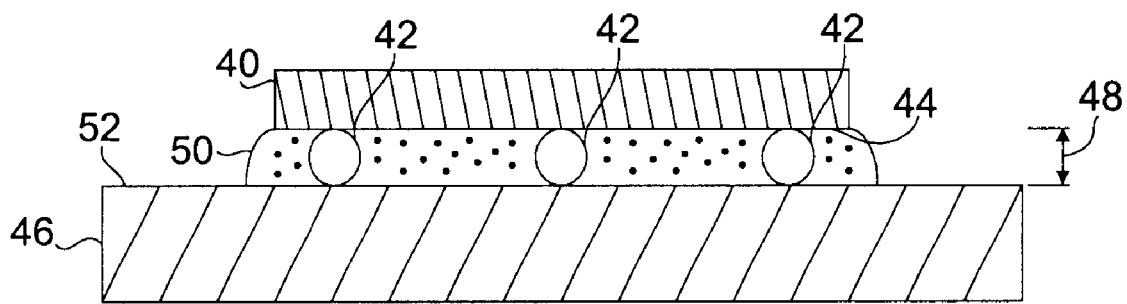
FIG. 2 shows a prior art flip-chip package assembly.
Figure 3:
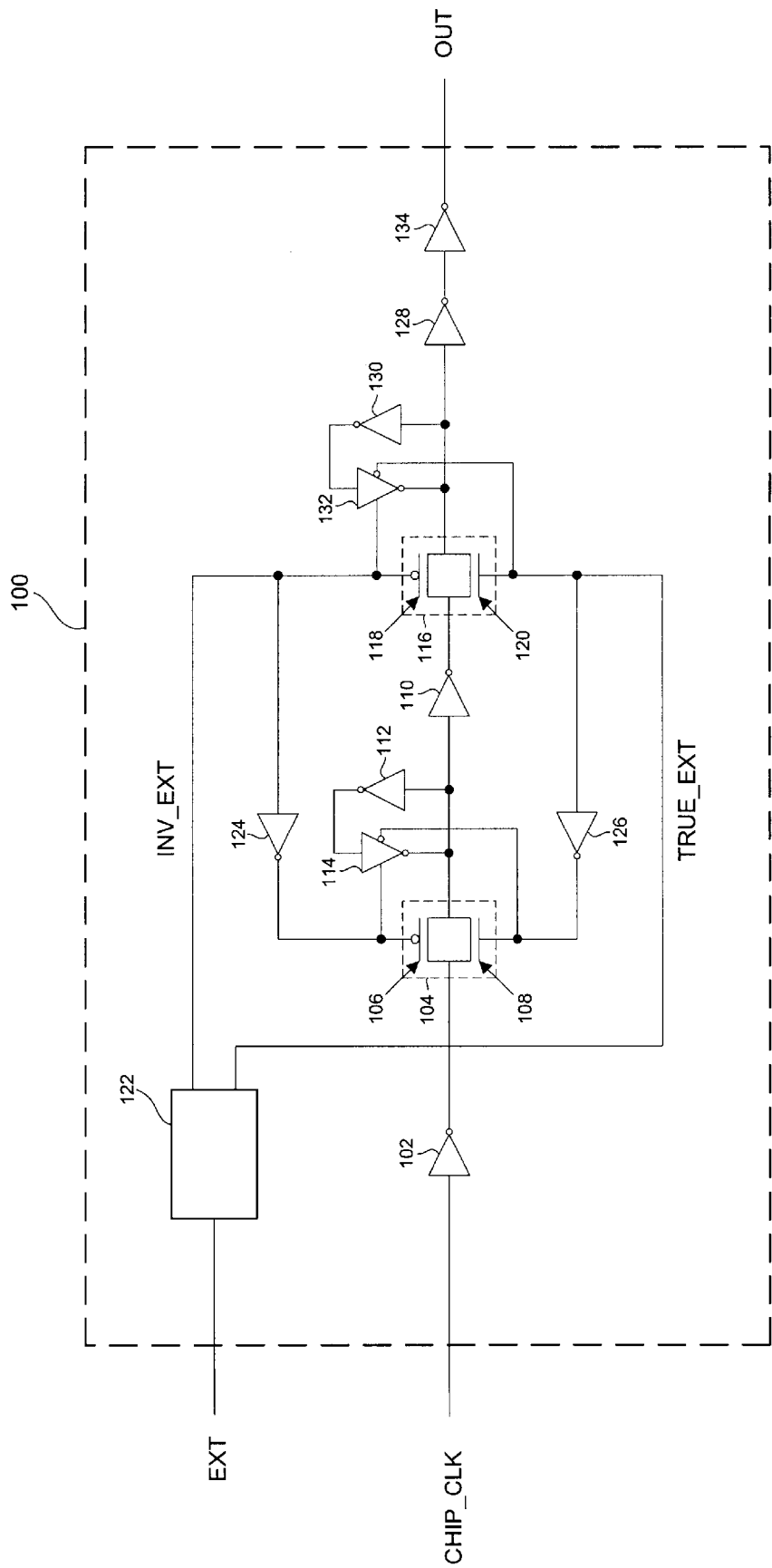
FIG. 3 shows a circuit schematic of an on-chip sampler in accordance with an embodiment of the present invention.

Referring to FIG. 3, an exemplary circuit schematic of an on-chip sampler (100) is shown in accordance with an embodiment of the present invention. The on-chip sampler (100) is primarily used to detect transitions, i.e., rising and falling edges, of an on-chip signal. An externally generated reference signal, EXT, and the on-chip signal, CHIP_CLK, serve as inputs to the on-chip sampler (100).

CHIP_CLK serves as an input to a first inverter (102), which, in turn, outputs to an input of a first transmission gate (104) formed by a first PMOS transistor (106) and a first NMOS transistor (108). The first transmission gate (104) outputs to an input of a second and third inverter (110, 112). The third inverter (112) outputs to an input of a first tri-state inverter (114), which, in turn, outputs to a gate terminal of the first PMOS transistor (106), a gate terminal of the first NMOS transistor (108), and to inputs of the second and third inverters (110, 112). The third inverter and the first tri-state inverter (112, 114) are in a keeper's configuration, i.e., the third inverter and the first tri-state inverter (112, 114) hold (also said to "latch") a value at the input of the second inverter (110) when the first transmission gate (104) is 'off.' The second inverter (110) outputs to an input of a second transmission gate (116) (discussed below) formed by a second PMOS transistor (118) and a second NMOS transistor (120). Moreover, the first transmission gate (104), first inverter (102), second inverter (110), third inverter (112), and first tri-state inverter (114) form a "first stage" of the on-chip sampler (100).

An inverting/buffering stage (122) (discussed below with reference to FIG. 4) inputs EXT and outputs true and inverted versions (referred to as "TRUE_EXT" and "INV_EXT", respectively) of EXT.

INV_EXT is connected to both an input to a fourth inverter (124) and to a gate terminal of the second PMOS transistor (118). Further, the fourth inverter (124) outputs to the gate terminal of the first PMOS transistor (106). TRUE_EXT is connected to an input to a fifth inverter (126) and to a gate terminal of the second NMOS transistor (120). Further, the fifth inverter (126) outputs to the gate terminal of the first NMOS transistor (108).

The second transmission gate (116) outputs to an input of a sixth and seventh inverter (128, 130). The seventh inverter (130) outputs to an input of a second tri-state inverter (132), which, in turn, outputs to the gate terminal of the second PMOS transistor (118), to the gate terminal of the second NMOS transistor (120), and to the inputs of the sixth and seventh inverters (128, 130). The seventh inverter (130) and the second tri-state inverter (132) are in a keeper's configuration, i.e., the seventh inverter (130) and the second tri-state inverter (132) hold (also said to "latch") a value at the input of the sixth inverter (128) when the second transmission gate (116) is 'off.' The sixth inverter (128) outputs to an input of a eighth inverter (134), which, in turn, outputs to an output, OUT, of the on-chip sampler (100). Moreover, the second transmission gate (116), sixth inverter (128), seventh inverter (130), second tri-state inverter (132), and eighth inverter (134) form a "second stage" of the on-chip sampler (100).

Further, the on-chip sampler (100) is designed such that EXT selectively samples CHIP_CLK on rising edges of EXT. However, those skilled in the art will appreciate that in other embodiments, CHIP_CLK may be sampled on falling edges or on both falling and rising edges of EXT.

Moreover, those skilled in the art will appreciate that the components, e.g., transistors and inverters, of the on-chip sampler (100) may be selectively sized in order to effectuate particular behavior within the on-chip sampler (100).

Discussions regarding operations of the on-chip sampler (100) are given below with reference to FIGS. 5a and 5b.

Figure 4:
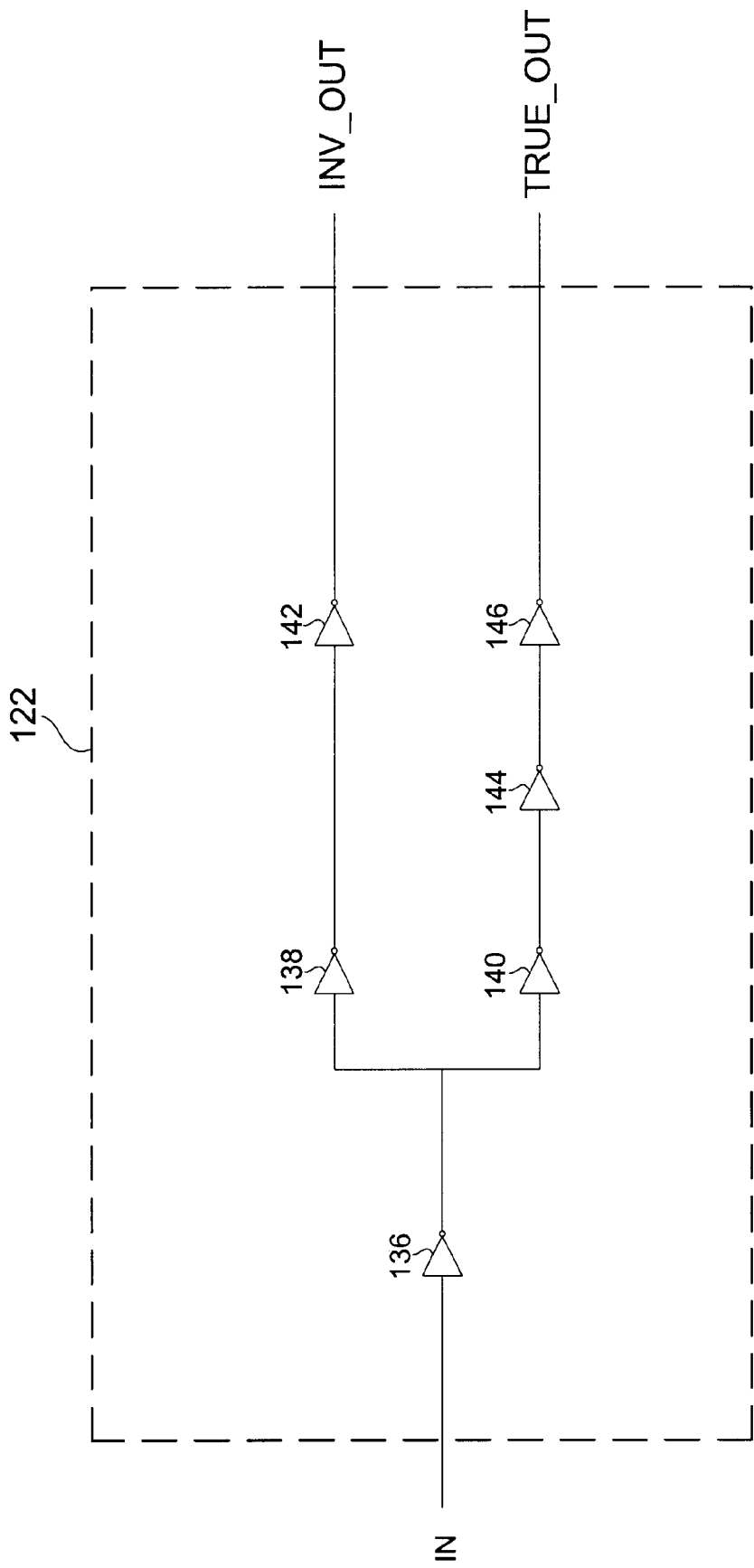
FIG. 4 shows a circuit schematic of a component of an on-chip sampler in accordance with the embodiment shown in FIG. 3.

FIG. 4 shows an exemplary inverting/buffering stage (122) in accordance with the embodiment shown in FIG. 3. An input signal, IN, to the inverting/buffering stage (122) serves as an input to a first inverter (136) of the inverting/buffering stage (122). The first inverter (136) of the inverting/buffering stage (122) serves as an input to both a second inverter (138) of the inverting/buffering stage (122) and a fourth inverter (140) of the inverting/buffering stage (122). The second inverter (138) of the inverting/buffering stage (122) outputs to an input of a third inverter (142) of the inverting/buffering stage (122), which, in turn, outputs an inverted version of IN, INV_OUT. The fourth inverter (140) of the inverting/buffering stage (122) outputs to an input of a fifth inverter (144) of the inverting/buffering stage (122).

The fifth inverter (144) of the inverting/buffering stage (122) outputs to an input of a sixth inverter (146) of the inverting/buffering stage (122), which, in turn, outputs a true version of IN, TRUE_OUT. INV_OUT and TRUE_OUT serve as outputs of the inverting/buffering stage (122).

Those skilled in the art will appreciate that the inverting/buffering stage (122) is designed such that the complementary output signals, INV_OUT and TRUE_OUT, intersect at 50% $V_{DD}$ across process corners. This ensures that the first and second transmission gates (104, 116) switch simultaneously as opposed to sequentially. However, in other embodiments, INV_OUT and TRUE_OUT may intersect at different voltage levels.

Figure 5A:
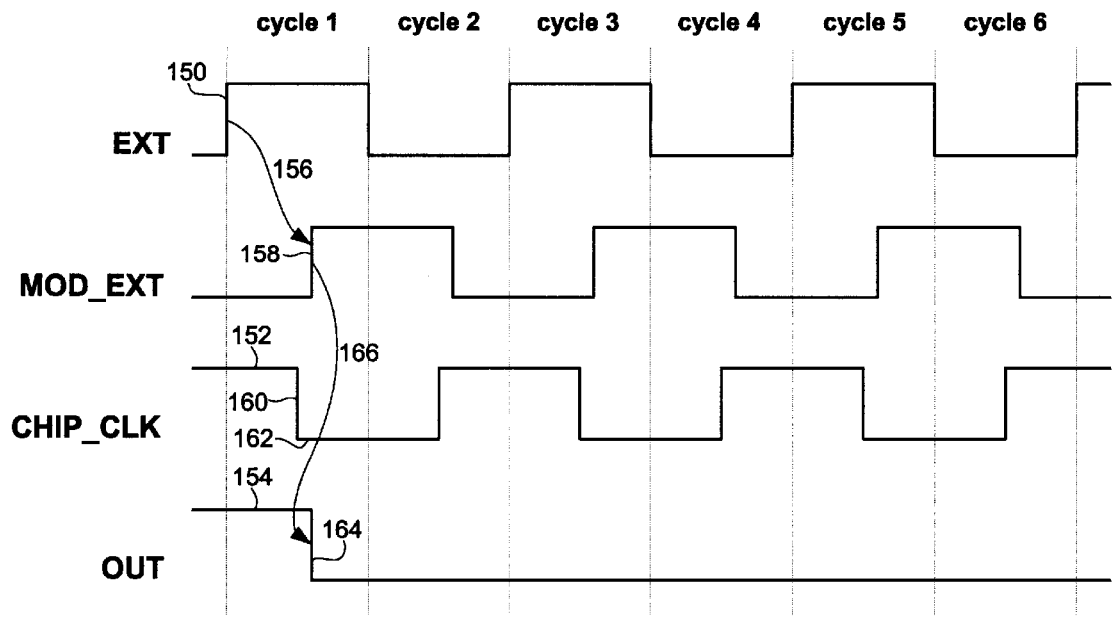
FIG. 5a shows a timing diagram in accordance with an operation of the embodiment shown in FIG. 3.

FIG. 5a shows an exemplary operation of the on-chip sampler (100) in accordance with the embodiment shown in FIG. 3. FIG. 5a shows timing waveforms for EXT, a modulated EXT (shown in FIG. 5a as "MOD_EXT"), CHIP CLK, and OUT.

At the beginning of cycle 1 of FIG. 5a, EXT goes high (150) and CHIP_CLK is already high (152) from a previous cycle (not shown). As EXT goes high (150), the inverting/buffering stage (122) outputs low on INV_EXT (shown in FIG. 3) and high on TRUE_EXT (shown in FIG. 3). This causes the second PMOS transmission gate (116) to switch 'on' because the second PMOS transistor (118) and the second NMOS transistor (120) switch 'on' due to the values of INV_EXT and TRUE_EXT, respectively. Further, the fourth inverter (124) outputs high to the gate terminal of the first PMOS transistor (106) and the fifth inverter (126) outputs low to the gate terminal of the first NMOS transistor (108) due to the values of INV_EXT and TRUE_EXT, respectively. Thus, as EXT goes high (150), the first transmission gate (104) switches 'off.'

Because the second transmission gate (116) switches 'on,' the value at the output of the second inverter (110) passes through the second transmission gate (116). However, since the first transmission gate (104) is 'off,' the value at the input of the second inverter (110) is determined by the value held by the third inverter (112) and first tri-state inverter (114).

The value held by the third inverter (112) and first tri-state inverter (114) is determined by the last value from the output of the first inverter (102) that passed through the first transmission gate (104). In this case, the last time that the first transmission gate (104) was 'on' was right before EXT goes high (150) at the beginning of cycle 1 of FIG. 5a. At that time, CHIP_CLK was high (152), and therefore the first inverter (102) outputted a low value which passed through the first transmission gate (104) to the input of the second inverter (110). This low value was then latched by the third inverter (112) and first tri-state inverter (114) such that a low value is held at the input of the second inverter (110) even after the first transmission gate (104) switches 'off' at the beginning of cycle 1 of FIG. 5a.

Thus, as the second transmission gate (116) switches 'on' at the beginning of cycle 1 of FIG. 5a, the second inverter (110) outputs a high value which passes through the second transmission gate (116) to the inputs of the sixth and seventh inverters (128, 130). The sixth inverter (128) then outputs low to the input of the eighth inverter (134), which, in turn, outputs high on OUT (154).

As discussed above, in order to detect a transition, i.e., a rising or falling edge, on CHIP_CLK, EXT is modulated (156). In FIG. 5a, EXT is modulated (156) as is shown by the MOD_EXT waveform.

In cycle 1 of FIG. 5a, a rising edge of MOD_EXT (158) passes a falling edge of CHIP_CLK (160). At this rising edge of MOD_EXT (158), the second transmission gate (116) switches 'on.' This allows the value at the output of the second inverter (110) to pass through the second transmission gate (116). However, since the first transmission gate (104) is 'off' due to MOD_EXT going high (158), the value at the input of the second inverter (110) is determined by the value held by the third inverter (112) and first tri-state inverter (114).

The value held by the third inverter (112) and first tri-state inverter (114) is determined by the last value from the output of the first inverter (102) that passed through the first transmission gate (104). In this case, the last time that the first transmission gate (104) was 'on' was right before MOD_EXT goes high (158) in cycle 1 of FIG. 5a. At that time, CHIP_CLK was low (162), and therefore the first inverter (102) outputted a high value which passed through the first transmission gate (104) to the input of the second inverter (110). This high value was then latched by the third inverter (112) and first tri-state inverter (114) such that a high value is held at the input of the second inverter (110) even after the first transmission gate (104) switches 'off' as MOD_EXT goes high (158) in cycle 1 of FIG. 5a.

Thus, as the second transmission gate (116) switches 'on' as MOD_EXT goes high (158) in cycle 1 of FIG. 5a, the second inverter (110) outputs a low value which passes through the second transmission gate (116) to the inputs of the sixth and seventh inverters (128, 130). The sixth inverter (128) then outputs high to the input of the eighth inverter (134), which, in turn, outputs low on OUT (164). Therefore, when the modulated EXT (shown as "MOD EXT" in FIG. 5a) detects a transition on CHIP_CLK, the output of the on-chip sampler (100) accordingly transitions. In other words, when MOD_EXT is modulated across a transition of CHIP_CLK, a rising edge of MOD_EXT causes the on-chip sampler (100) to detect the transition and accordingly indicate the detected transition at OUT (166).

Referring to the operation of the on-chip sampler (100) discussed with reference to FIG. 5a, those skilled in the art will appreciate that the value at OUT may already be low before MOD_EXT samples a falling edge on CHIP_CLK (as shown in cycle 3 and cycle 5 of FIG. 5a) because MOD_EXT sampled an earlier falling edge on CHIP_CLK that caused OUT to go low (as in cycle 1 of FIG. 5a).

Figure 5B:
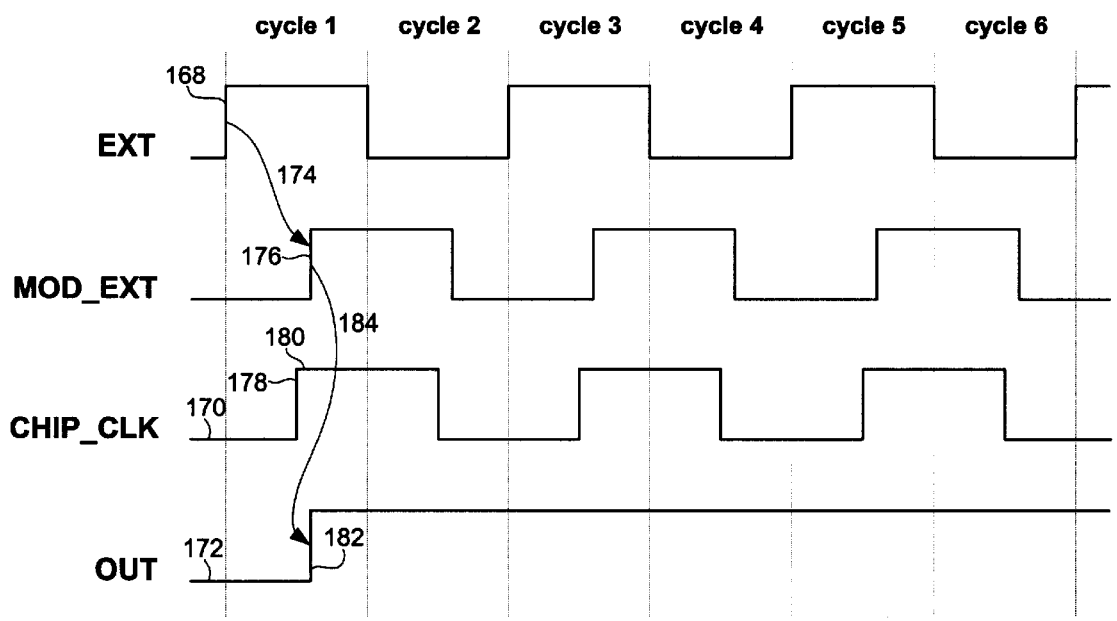
FIG. 5b shows a timing diagram in accordance with another operation of the embodiment shown in FIG. 3.

FIG. 5b shows another exemplary operation of the on-chip sampler (100) in accordance with the embodiment shown in FIG. 3. FIG. 5b shows timing waveforms for EXT, a modulated EXT (shown in FIG. 5b as "MOD_EXT"), CHIP_CLK, and OUT.

At the beginning of cycle 1 of FIG. 5b, EXT goes high (168) and CHIP_CLK is already low (170) from a previous cycle (not shown). As EXT goes high (168), the inverting/buffering stage (122) outputs low on INV_EXT (shown in FIG. 3) and high on TRUE_EXT (shown in FIG. 3). This causes the second PMOS transmission gate (116) to switch 'on' because the second PMOS transistor (118) and the second NMOS transistor (120) switch 'on' due to the values of INV_EXT and TRUE_EXT, respectively. Further, the fourth inverter (124) outputs high to the gate terminal of the first PMOS transistor (106) and the fifth inverter (126) outputs low to the gate terminal of the first NMOS transistor (108) due to the values of INV_EXT and TRUE_EXT, respectively. Thus, as EXT goes high (168), the first transmission gate (104) switches 'off.'

Because the second transmission gate (116) switches 'on,' the value at the output of the second inverter (110) passes through the second transmission gate (116). However, since the first transmission gate (104) is 'off,' the value at the input of the second inverter (110) is determined by the value held by the third inverter (112) and first tri-state inverter (114).

The value held by the third inverter (112) and first tri-state inverter (114) is determined by the last value from the output of the first inverter (102) that passed through the first transmission gate (104). In this case, the last time that the first transmission gate (104) was 'on' was right before EXT goes high (168) at the beginning of cycle 1 of FIG. 5b. At that time, CHIP_CLK was low (170), and therefore the first inverter (102) outputted a high value which passed through the first transmission gate (104) to the input of the second inverter (110). This high value was then latched by the third inverter (112) and first tri-state inverter (114) such that a high value is held at the input of the second inverter (110) even after the first transmission gate (104) switches 'off' at the beginning of cycle 1 of FIG. 5b.

Thus, as the second transmission gate (116) switches 'on' at the beginning of cycle 1 of FIG. 5b, the second inverter (110) outputs a low value which passes through the second transmission gate (116) to the inputs of the sixth and seventh inverters (128, 130). The sixth inverter (128) then outputs high to the input of the eighth inverter (134), which, in turn, outputs low on OUT (170).

As discussed above, in order to detect a transition, i.e., a rising or falling edge, on CHIP_CLK, EXT is modulated (174). In FIG. 5b, EXT is modulated (174) as is shown by the MOD_EXT waveform.

In cycle 1 of FIG. 5b, a rising edge of MOD_EXT (176) passes a rising edge of CHIP_CLK (178). At this rising edge of MOD_EXT (176), the second transmission gate (116) switches 'on.' This allows the value at the output of the second inverter (110) to pass through the second transmission gate (116). However, since the first transmission gate (104) is 'off' due to MOD_EXT going high (176), the value at the input of the second inverter (110) is determined by the value held by the third inverter (112) and first tri-state inverter (114).

The value held by the third inverter (112) and first tri-state inverter (114) is determined by the last value from the output of the first inverter (102) that passed through the first transmission gate (104). In this case, the last time that the first transmission gate (104) was 'on' was right before MOD_EXT goes high (176) in cycle 1 of FIG. 5b. At that time, CHIP_CLK was high (180), and therefore the first inverter (102) outputted a low value which passed through the first transmission gate (104) to the input of the second inverter (110). This low value was then latched by the third inverter (112) and first tri-state inverter (114) such that a low value is held at the input of the second inverter (110) even after the first transmission gate (104) switches 'off' as MOD_EXT goes high (176) in cycle 1 of FIG. 5b.

Thus, as the second transmission gate (116) switches 'on' as MOD_EXT goes high (176) in cycle 1 of FIG. 5b, the second inverter (110) outputs a high value which passes through the second transmission gate (116) to the inputs of the sixth and seventh inverters (128, 130). The sixth inverter (128) then outputs low to the input of the eighth inverter (134), which, in turn, outputs high on OUT (182). Therefore, when the modulated EXT (shown as "MOD EXT" in FIG. 5b) detects a transition on CHIP_CLK, the output of the on-chip sampler (100) accordingly transitions. In other words, when MOD_EXT is modulated across a transition of CHIP_CLK, a rising edge of MOD_EXT causes the on-chip sampler (100) to detect the transition and accordingly indicate the detected transition at OUT (184).

Referring to the operation of the on-chip sampler (100) discussed with reference to FIG. 5b, those skilled in the art will appreciate that the value at OUT may already be high before MOD_EXT samples a rising edge on CHIP_CLK (as shown in cycle 3 and cycle 5 of FIG. 5b) because MOD_EXT sampled an earlier rising edge on CHIP_CLK that caused OUT to go high (as in cycle 1 of FIG. 5b).

Further, those skilled in the art will appreciate that although EXT, MOD_EXT, and CHIP_CLK have frequencies equal to each other in FIGS. 5a and 5b, other embodiments may involve EXT, MOD_EXT, and CHIP_CLK having different frequencies to each other.

Moreover, those skilled in the art will appreciate that in other embodiments, EXT may be modulated in a direction opposite to the direction EXT was modulated in FIGS. 5a and 5b.

Figure 6:
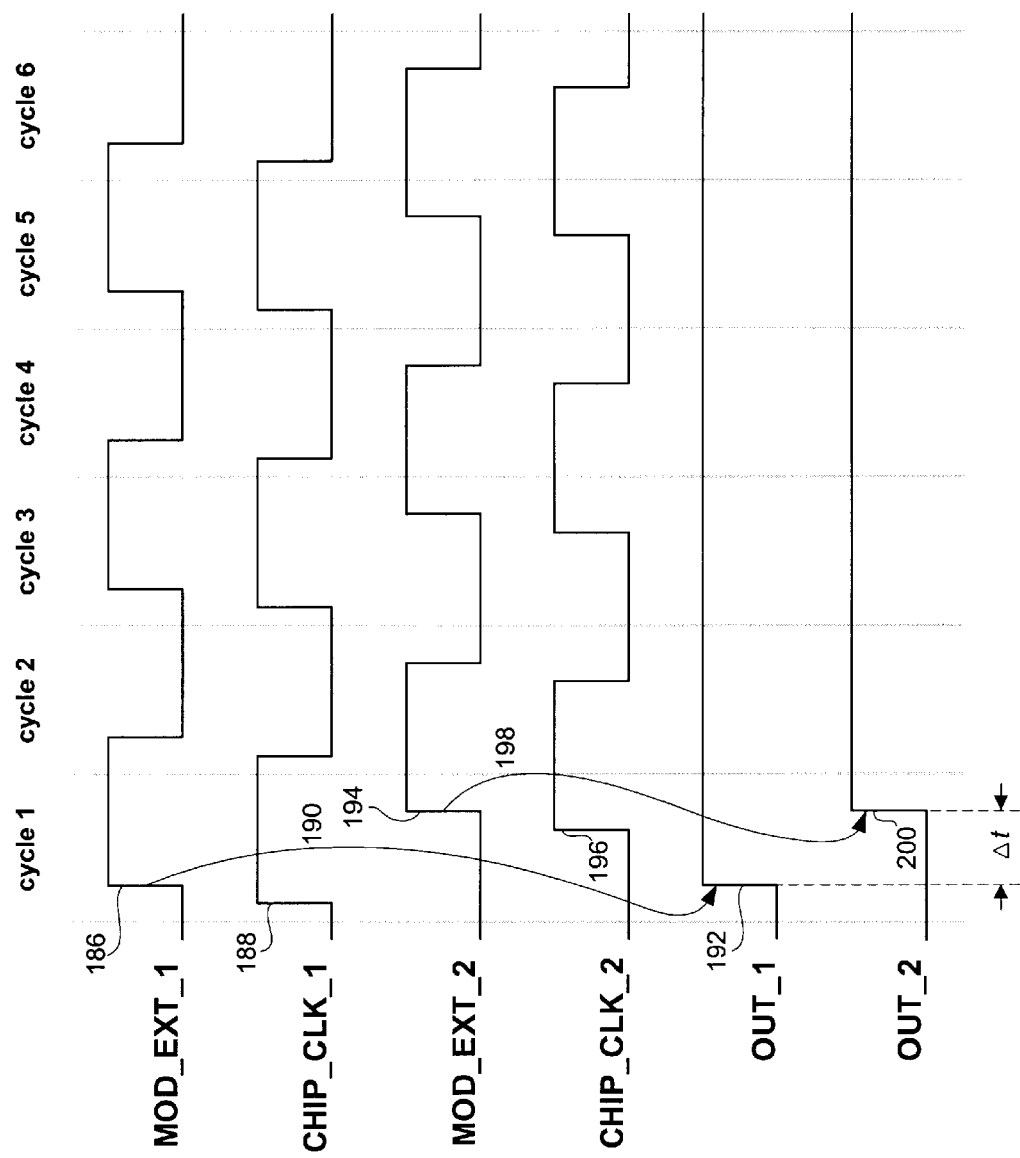
FIG. 6 shows a timing diagram in accordance an embodiment of the present invention.

By using an externally supplied clock to detect transitions on a global on-chip signal, the skew of the global on-chip signal between different points on a chip can be determined by using a plurality of on-chip samplers. FIG. 6 shows a timing diagram which illustrates how skew of a global on-chip signal between two different points can be determined by using on-chip samplers. FIG. 6 shows timing waveforms for a first modulated signal, MOD_EXT_1, an on-chip signal at a first point, CHIP_CLK_1, a second modulated signal, MOD_EXT_2, the on-chip signal at a second point, CHIP_CLK_2, an output from a first on-chip sampler (not shown), OUT_1, and an output from a second on-chip sampler (not shown), OUT_2.

The first on-chip sampler inputs MOD_EXT_1 and CHIP_CLK_1, and the second on-chip sampler inputs MOD_EXT_2 and CHIP_CLK_2. The first and second on-chip samplers are positioned at different points on a chip.

In cycle 1 of FIG. 6, a rising edge of MOD_EXT_1 (186) passes across a rising edge of CHIP_CLK_1 (188), after which (190), a rising edge is generated at OUT_1 (192). Also in cycle 1 of FIG. 6, a rising edge of MOD_EXT_2 (194) passes across a rising edge of CHIP_CLK_2 (196), after which (198), a rising edge is generated at OUT_2 (200).

The difference, $\Delta t$ (also referred to as "phase offset") (shown in FIG. 6), between the rising edges of OUT_1 and OUT_2 in cycle 1 of FIG. 6, directly relates to the skew of the on-chip signal between the points at which the first and second on-chip samplers are positioned.

Figure 7:
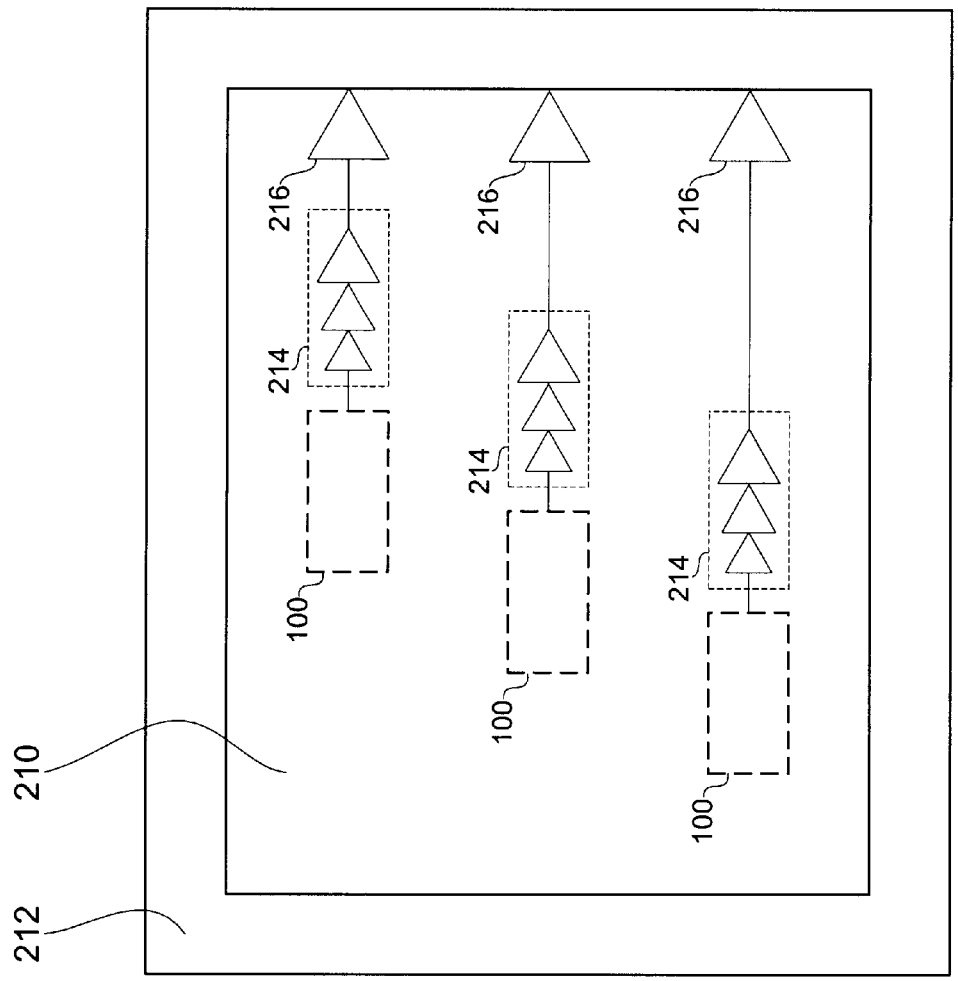
FIG. 7 shows a distribution of a plurality of on-chip samplers on a computer chip in accordance with an embodiment of the present invention.

Referring now to FIG. 7, a distribution of a plurality of on-chip samplers on a computer chip (210) is shown. Each on-chip sampler (100) is followed by a set of buffers (214) that drives the digital output of the on-chip sampler (100) to an input/output driver (also referred to as "I/O driver") (216) at the perimeter of the computer chip (210). The I/O driver (216) then drives the digital output of the on-chip sampler (100) through a chip package (212).

Figure 8A:
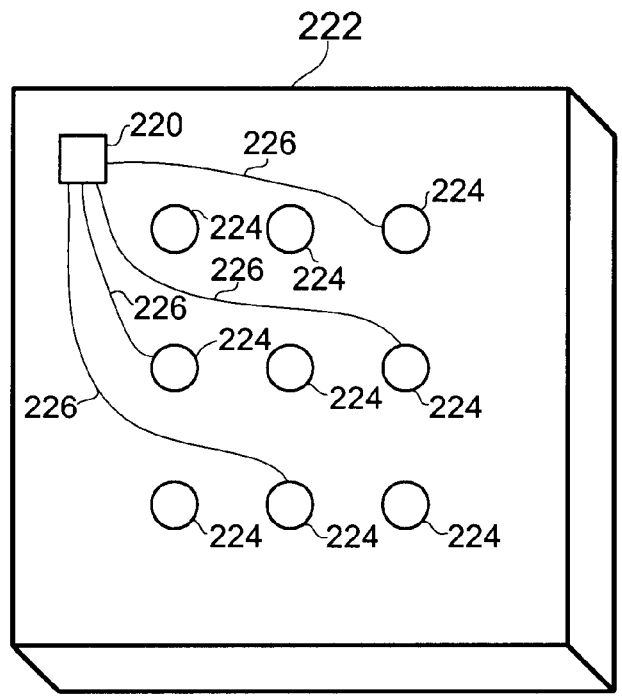
FIG. 8a shows a distribution of an externally generated reference signal on a chip package in accordance with an embodiment of the present invention.

Referring to FIG. 8a, a distribution of an externally generated reference signal (220) on top of a chip package (222) is shown in accordance with an embodiment of the present invention. As shown in FIG. 8a, the externally generated reference signal (220) is distributed on a top layer of the chip package (222) without going through pin leads (not shown) on the backside of the chip package (222). The externally generated reference signal (220) is coupled to a plurality of bumps (224) by means of a plurality of transmissions lines (226). Those skilled in the art will appreciate that the externally generated reference signal (220) may be coupled to the plurality of bumps (224) via other means.

Figure 8B:
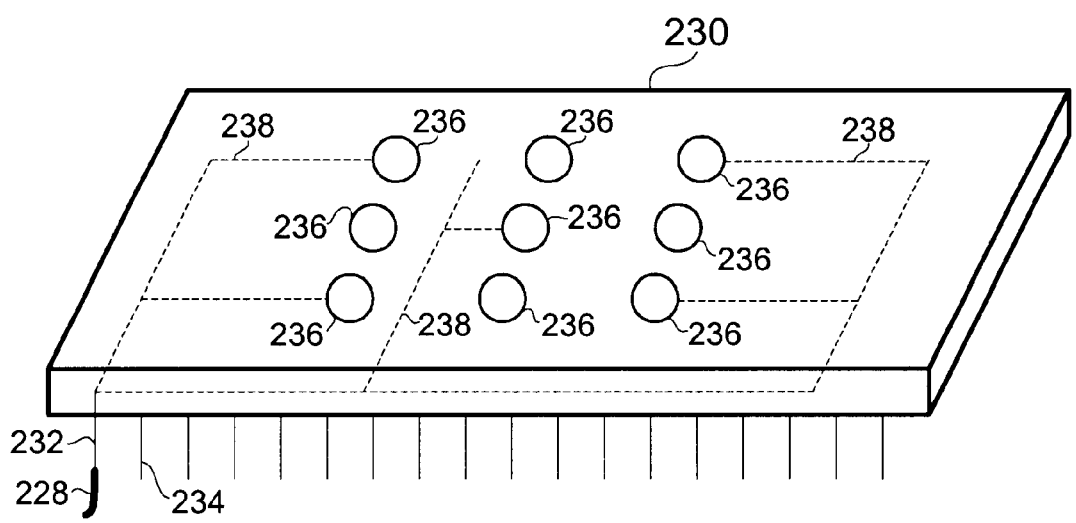
FIG. 8b shows a distribution of an externally generated reference signal within a chip package in accordance with an embodiment of the present invention.

FIG. 8b shows an alternative distribution of an externally generated reference signal (228) within a chip package (230) in accordance with an embodiment of the present invention. As shown in FIG. 8b, the externally generated reference signal (228) is distributed within the chip package (230) through one (232) among many pins (234). The externally generated reference signal (228) is then coupled to a plurality of bumps (236) via package traces (238) within the chip package (230).

Advantages of the present invention may include one or more of the following. In one or more embodiments, skew of an on-chip signal may be measured by using one or more on-chip samplers which use an externally generated reference signal to sample to the on-chip signal.

In some embodiments, an externally generated reference signal used to sample an on-chip signal is adjustable and may be modulated according to the effectuation of particular behavior.

In some embodiments, an externally generated reference signal may be at a lower frequency than an on-chip signal. This improves the feasibility in inputting the externally generated reference signal into components on a chip.

In some embodiments, a path delay of an output from an on-chip sampler outputs does not affect measured skew because only the logical value of the output of the on-chip sampler is considered, i.e., the skew is measured as the phase-offset.

In some embodiments, an inverting/buffering stage within an on-chip sampler generates sampling signal edges that cross at approximately 50% $V_{DD}$ across process variations. This leads to less uncertainty in skew measurements.

In some embodiments, skew introduced in a distribution of an externally generated reference signal on top of a chip package may be measured and calibrated out.

In some embodiments, because a distribution of an externally generated reference signal may occur on top of a chip package, distortion and noise injection through pin leads on a chip package is minimized.

In some embodiments, an externally generated reference signal may be distributed within a chip package via one pin on the chip package. This is beneficial because it requires minimal effort to distribute the externally generated reference signal.

In some embodiments, skew introduced in a distribution of an externally generated reference signal within a chip package may be measured and calibrated out.

In some embodiments, an externally generated reference signal is used as a sampling signal. This is advantageous because it allows controllability of the sampling signal due to it being externally generated.

In some embodiments, because physical probing is not required to determine skew of an on-chip signal, the present invention provides a method and apparatus by which signal skew can be determined on chips packaged in flip-chip packages.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for measuring skew of an on-chip signal on a computer chip, comprising:
    distributing an externally generated reference signal to the computer chip;
    inputting the externally generated reference signal and the on-chip signal to a first on-chip sampler, wherein the first on-chip sampler is disposed on a first portion of the computer chip;
    inputting the externally generated reference signal and the on-chip signal to a second on-chip sampler, wherein the second on-chip sampler is disposed on a second portion of the computer chip;
    selectively modulating the externally generated reference signal to determine at least one transition of the on-chip signal at the first portion and the second portion; and
    determining skew of the on-chip signal between the first portion and the second portion dependent upon an output from the first on-chip sampler and an output from the second on-chip sampler.

2. The method of claim 1, wherein the externally generated reference signal is distributed on top of a chip package.

3. The method of claim 1, wherein the externally generated reference signal is distributed within a chip package via at least one pin on the chip package.

4. The method of claim 1, wherein the externally generated reference signal samples the on-chip signal at the first on-chip sampler and at the second on-chip sampler.

5. The method of claim 1, further comprising:
    selectively modulating the externally generated reference signal to detect a transition of the on-chip signal at the first on-chip sampler;
    outputting a first transition indication from the first on-chip sampler when the transition is detected at the first on-chip sampler;
    selectively modulating the externally generated reference signal to detect the transition of the on-chip signal at the second on-chip sampler;
    outputting a second transition indication from the second on-chip sampler when the transition is detected at the second on-chip sampler; and
    determining skew of the on-chip signal between the first portion and the second portion based on the difference between the first transition indication and the second transition indication.

6. The method of claim 1, wherein the externally generated reference signal is adjustable.

7. An on-chip sampler that is used to measure skew of an on-chip signal, comprising:
    an inverting/buffering stage that inputs an externally generated reference signal and generates a first control signal and a second control signal that are used in the on-chip sampler;
    a first stage that inputs the on-chip signal and outputs a signal to the second stage based on the first and second control signals; and
    a second stage that inputs the signal outputted from the first stage based on the first and second control signals,
    wherein the externally generated reference signal is modulated to detect a transition on the on-chip signal.

8. The on-chip sampler of claim 7, wherein the transition is passed to an output of the on-chip sampler.

9. The on-chip sampler of claim 8, wherein the transition at the output of the on-chip sampler is compared with a transition at an output of a second on-chip sampler to determine skew of the on-chip signal between locations of the on-chip sampler and the second on-chip sampler.

10. The on-chip sampler of claim 9, wherein the output of the on-chip sampler is buffered and driven to an edge of a chip on which the on-chip sampler resides.

11. The on-chip sampler of claim 7, wherein the externally generated reference signal is adjustable.

12. The on-chip sampler of claim 7, wherein the inverting/buffering stage generates a third control signal that is used in the on-chip sampler.

13. The on-chip sampler of claim 7, wherein the second stage generates an output of the on-chip sampler.

14. A distribution of on-chip samplers, comprising:
    a first on-chip sampler disposed on a first portion of a computer chip;
    a second on-chip sampler disposed on a second portion of the computer chip; and
    a last on-chip sampler disposed on a last portion of the computer chip,
    wherein an externally generated reference signal and an on-chip signal serves as inputs to the first, second, and last on-chip samplers.

15. The distribution of claim 14, wherein the externally generated reference signal is modulated to detect a first transition of the on-chip signal, and wherein the externally generated reference signal is then modulated to detect a second transition of the on-chip signal.

16. The distribution of claim 15, wherein the first transition is detected by one selected from the group consisting of the first on-chip sampler, the second on-chip sampler, and the last on-chip sampler.

17. The distribution of claim 15, wherein the second transition is detected by one selected from the group consisting of the first on-chip sampler, the second on-chip sampler, and the last on-chip sampler.

18. The distribution of claim 15, wherein skew of the on-chip signal is determined by the difference between the first transition and second transition.

* * * * *